United States Patent
Hong

(10) Patent No.: US 12,101,874 B2
(45) Date of Patent: Sep. 24, 2024

(54) RIGID FLEXIBLE PRINTED CIRCUIT BOARD AND ELECTRONIC DEVICE INCLUDING THE SAME

(71) Applicant: SAMSUNG ELECTRONICS CO., LTD., Suwon-si (KR)

(72) Inventor: Eunseok Hong, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 174 days.

(21) Appl. No.: 17/962,286

(22) Filed: Oct. 7, 2022

(65) Prior Publication Data

US 2023/0035851 A1 Feb. 2, 2023

Related U.S. Application Data

(63) Continuation of application No. PCT/KR2022/010256, filed on Jul. 14, 2022.

(30) Foreign Application Priority Data

Jul. 19, 2021 (KR) .................. 10-2021-0094407

(51) Int. Cl.
*H05K 1/02* (2006.01)

(52) U.S. Cl.
CPC ......... *H05K 1/0219* (2013.01); *H05K 1/0278* (2013.01); *H05K 2201/0715* (2013.01); *H05K 2201/0723* (2013.01); *H05K 2201/09609* (2013.01)

(58) Field of Classification Search
CPC ....................................... H05K 1/0277–1/0283
See application file for complete search history.

(56) References Cited

U.S. PATENT DOCUMENTS

| | | | |
|---|---|---|---|
| 7,135,643 B2 | 11/2006 | Van Haaster et al. | |
| 7,541,898 B2 | 6/2009 | Qian et al. | |
| 8,975,987 B2 | 3/2015 | Kinpara et al. | |

FOREIGN PATENT DOCUMENTS

| | | |
|---|---|---|
| JP | 07-263911 | 10/1995 |
| JP | 2001-77240 A | 3/2001 |
| KR | 2003-0074582 | 9/2003 |
| KR | 10-0666224 | 1/2007 |

(Continued)

OTHER PUBLICATIONS

International Search Report for PCT/KR2022/010256 mailed Nov. 10, 2022, 3 pages.

*Primary Examiner* — Jeremy C Norris
(74) *Attorney, Agent, or Firm* — Nixon & Vanderhye, P.C.

(57) ABSTRACT

A rigid flexible printed circuit board (RFPCB) may include: a first base conductive layer; a first rigid conductive layer spaced apart from the first base conductive layer in a first direction; a second rigid conductive layer spaced apart from the first base conductive layer in the first direction and spaced apart from the first rigid conductive layer in a second direction intersecting the first direction; a base cover layer spaced apart from the first base conductive layer in the first direction and positioned closer to the first base conductive layer than to the first rigid conductive layer and the second rigid conductive layer; a transmission line positioned between the first base conductive layer and the base cover layer; and a dummy metal layer disposed on the base cover layer, positioned between the first rigid conductive layer and the second rigid conductive layer, and overlapping the transmission line in the first direction.

20 Claims, 11 Drawing Sheets

(56) References Cited

FOREIGN PATENT DOCUMENTS

| KR | 10-2017-0140691 | 12/2017 |
| KR | 10-2019-0101826 | 9/2019 |
| KR | 10-2021-0081968 | 7/2021 |

RIGID FLEXIBLE PRINTED CIRCUIT BOARD AND ELECTRONIC DEVICE INCLUDING THE SAME

CROSS-REFERENCE TO RELATED APPLICATIONS

This application is a continuation of International Application No. PCT/KR2022/010256 designating the United States, filed on Jul. 14, 2022, in the Korean Intellectual Property Receiving Office and claiming priority to Korean Patent Application No. 10-2021-0094407, filed on Jul. 19, 2021, in the Korean Intellectual Property Office, the disclosures of which are incorporated by reference herein in their entireties.

BACKGROUND

1. Field

The disclosure relates to a rigid flexible printed circuit board (RFPCB) and an electronic device including the same.

2. Description of Related Art

Various types of electronic devices, such as smart phones, tablet personal computers (PCs), or personal digital assistants (PDAs), are provided with the development of digital technology. To improve portability and user accessibility, types of electronic devices that users may wear are also being developed. With the development of wireless communication technology, electronic devices (e.g., electronic devices for communications) are commonly used in daily life, leading to an exponential increase in the use of content. An electronic device may include a rigid flexible printed circuit board (RFPCB) for electrically connecting elements (e.g., components or circuits).

The RFPCB may include a printed circuit board (PCB) for radio frequency (RF) transmission. The RFPCB may include a flexible portion that is bendable and a rigid portion that is not bendable. The RFPCB may include a plurality of conductive vias. The conductive vias are formed of a rigid material and thus, are not technically easy to arrange in a flexible portion. The plurality of conductive vias may be provided only in a rigid portion and not be provided in a flexible portion.

The RFPCB may include a transmission line (e.g., an RF line). The plurality of conductive vias may be arranged in a longitudinal direction of the transmission line, and a resonant frequency of the transmission line may be determined according to a distance between two adjacent conductive vias of the plurality of conductive vias. For example, as the distance between two adjacent conductive vias decreases, the resonant frequency of the transmission line may be formed high. Conversely, as the distance between two adjacent conductive vias increases, the resonant frequency of the transmission line may be formed low.

For normal transmission in a wireless frequency band in a set range through a rigid flexible printed circuit board (RFPCB), it is necessary to prevent the formation of a resonant frequency within the set range and to induce the resonant frequency to be formed higher than the set range. However, since it is difficult to provide conductive vias in a flexible portion of an RFPCB, a low resonant frequency may be formed in the flexible portion.

A method of shortening the length of a flexible portion of an RFPCB may be considered, but if the length of the flexible portion decreases, the risk of cracks occurring may increase, and the assemblability of the RFPCB in an electronic device may decrease. There is a demand for a technique for forming a high resonant frequency without changing the length of a flexible portion of an RFPCB.

In order to sufficiently secure the flexibility of the RFPCB, it is necessary to sufficiently secure the length of the flexible portion of the RFPCB. A technique for sufficiently securing the length of a flexible portion of an RFPCB while improving resonance in a designated band (e.g., a 14-GHz band) is required. In addition, a technique for sufficiently securing the length of a flexible portion of an RFPCB while improving resonance, for example, up to 40 GHz based on a high frequency band (e.g., a mmWave band) is required.

SUMMARY

Embodiments of the disclosure provide an RFPCB and an electronic device including the same.

According to various example embodiments, an electronic device may include: a rigid flexible printed circuit board (RFPCB), wherein the RFPCB may include: a first base conductive layer; a first rigid conductive layer spaced apart from the first base conductive layer in a first direction; a second rigid conductive layer spaced apart from the first base conductive layer in the first direction and spaced apart from the first rigid conductive layer in a second direction intersecting the first direction; a base cover layer spaced apart from the first base conductive layer in the first direction and positioned closer to the first base conductive layer than to the first rigid conductive layer and the second rigid conductive layer; a transmission line positioned between the first base conductive layer and the base cover layer; and a dummy metal layer disposed on the base cover layer, positioned between the first rigid conductive layer and the second rigid conductive layer, and overlapping the transmission line in the first direction.

According to various example embodiments, a rigid flexible printed circuit board (RFPCB) may include: a first base conductive layer; a first rigid conductive layer spaced apart from the first base conductive layer in a first direction; a second rigid conductive layer spaced apart from the first base conductive layer in the first direction and spaced apart from the first rigid conductive layer in a second direction intersecting the first direction; a base cover layer spaced apart from the first base conductive layer in the first direction and positioned closer to the first base conductive layer than to the first rigid conductive layer and the second rigid conductive layer; a transmission line positioned between the first base conductive layer and the base cover layer; and a dummy metal layer disposed on the base cover layer, positioned between the first rigid conductive layer and the second rigid conductive layer, and overlapping the transmission line in the first direction.

According to various example embodiments, an electronic device may include a rigid flexible printed circuit board (RFPCB), wherein the RFPCB may include: a first base conductive layer; a second base conductive layer spaced apart from the first base conductive layer in a first direction; a dielectric positioned between the first base conductive layer and the second base conductive layer; a first rigid conductive layer positioned on an opposite side of the first base conductive layer with respect to the second base conductive layer; a second rigid conductive layer spaced apart from the first rigid conductive layer in a second direction intersecting the first direction; a base cover layer spaced apart from the first base conductive layer in the first direction and positioned closer to the first base conductive layer than to the first rigid conductive layer and the second rigid conductive layer; a transmission line positioned between the first base conductive layer and the base cover layer; a plurality of first conductive vias connecting the first base conductive layer and the first rigid conductive layer; a plurality of second conductive vias connecting the second base conductive layer and the second rigid conductive layer; and a dummy metal layer positioned between the first rigid conductive layer and the second rigid conductive layer, positioned between the first conductive vias and the second conductive vias, and overlapping the transmission line in the first direction.

An RFPCB and an electronic device including the same according to various example embodiments of the present disclosure may cause a high resonant frequency to be formed without changing the length of a flexible portion of the RFPCB.

For example, the RFPCB and the electronic device including the same according to various example embodiments of the present disclosure may include a dummy metal layer on the flexible portion to form a high resonant frequency high, thereby preventing and/or reducing a resonance phenomenon.

In addition, various effects directly or indirectly ascertained through the present disclosure may be provided.

BRIEF DESCRIPTION OF THE DRAWINGS

The above and other aspects, features, and advantages of certain embodiments of the present disclosure will be more apparent from the following detailed description, taken in conjunction with the accompanying drawings, in which.

DETAILED DESCRIPTION

Figure 1:
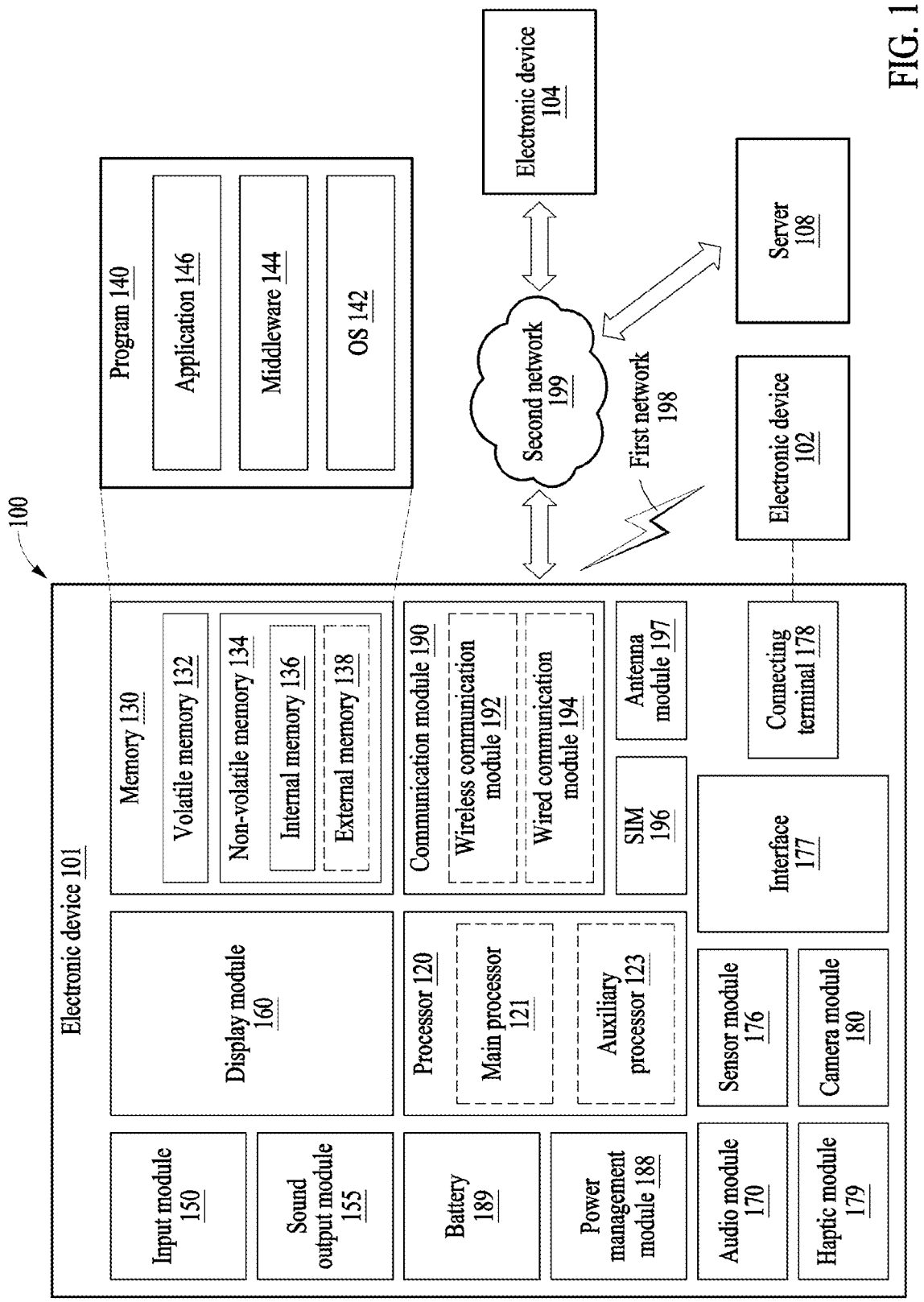
FIG. 1 is a block diagram illustrating an example electronic device in a network environment according to various embodiments.

Hereinafter, various example embodiments will be described in greater detail with reference to the accompanying drawings. When describing the example embodiments with reference to the accompanying drawings, like reference numerals refer to like elements and a repeated description related thereto will be omitted.

FIG. 1 is a block diagram illustrating an example electronic device 101 in a network environment 100 according to various embodiments. Referring to FIG. 1, the electronic device 101 in the network environment 100 may communicate with an electronic device 102 via a first network 198 (e.g., a short-range wireless communication network), or communicate with at least one of an electronic device 104 or a server 108 via a second network 199 (e.g., a long-range wireless communication network). According to an example embodiment, the electronic device 101 may communicate with the electronic device 104 via the server 108. According to an example embodiment, the electronic device 101 may include a processor 120, a memory 130, an input module 150, a sound output module 155, a display module 160, an audio module 170, a sensor module 176, an interface 177, a connecting terminal 178, a haptic module 179, a camera module 180, a power management module 188, a battery 189, a communication module 190, a subscriber identification module (SIM) 196, or an antenna module 197. In various example embodiments, at least one (e.g., the connecting terminal 178) of the above components may be omitted from the electronic device 101, or one or more other components may be added in the electronic device 101. In various example embodiments, some (e.g., the sensor module 176, the camera module 180, or the antenna module 197) of the components may be integrated as a single component (e.g., the display module 160).

The processor 120 may execute, for example, software (e.g., a program 140) to control at least one other component (e.g., a hardware or software component) of the electronic device 101 connected to the processor 120, and may perform various data processing or computation. According to an example embodiment, as at least a portion of data processing or computation, the processor 120 may store a command or data received from another component (e.g., the sensor module 176 or the communication module 190) in a volatile memory 132, process the command or the data stored in the volatile memory 132, and store resulting data in a non-volatile memory 134. According to an example embodiment, the processor 120 may include a main processor 121 (e.g., a central processing unit (CPU) or an application processor (AP)) or an auxiliary processor 123 (e.g., a graphics processing unit (GPU), a neural processing unit (NPU), an image signal processor (ISP), a sensor hub processor, or a communication processor (CP)) that is operable independently of, or in conjunction with the main processor 121. For example, when the electronic device 101 includes the main processor 121 and the auxiliary processor 123, the auxiliary processor 123 may be adapted to consume less power than the main processor 121 or to be specific to a specified function. The auxiliary processor 123 may be implemented separately from the main processor 121 or as a portion of the main processor 121.

The auxiliary processor 123 may control at least some of functions or states related to at least one (e.g., the display module 160, the sensor module 176, or the communication module 190) of the components of the electronic device 101, instead of the main processor 121 while the main processor 121 is in an inactive (e.g., sleep) state or along with the main processor 121 while the main processor 121 is in an active state (e.g., executing an application). According to an example embodiment, the auxiliary processor 123 (e.g., an ISP or a CP) may be implemented as a portion of another component (e.g., the camera module 180 or the communication module 190) that is functionally related to the auxiliary processor 123. According to an example embodiment, the auxiliary processor 123 (e.g., an NPU) may include a hardware structure specified for artificial intelligence (AI) model processing. An AI model may be generated by machine learning. Such learning may be performed by, for example, the electronic device 101 in which an artificial intelligence model is executed, or performed via a separate server (e.g., the server 108). Learning algorithms may include, but are not limited to, for example, supervised learning, unsupervised learning, semi-supervised learning, or reinforcement learning. The artificial intelligence model may include a plurality of artificial neural network layers. An artificial neural network may include, for example, a deep neural network (DNN), a convolutional neural network (CNN), a recurrent neural network (RNN), a restricted Boltzmann machine (RBM), a deep belief network (DBN), and a bidirectional recurrent deep neural network (BRDNN), a deep Q-network, or a combination of two or more thereof, but is not limited thereto. The artificial intelligence model may additionally or alternatively, include a software structure other than the hardware structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 or the non-volatile memory 134. The non-volatile memory 134 may include an internal memory 136 and an external memory 138.

The program 140 may be stored as software in the memory 130, and may include, for example, an operating system (OS) 142, middleware 144, or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output a sound signal to the outside of the electronic device 101. The sound output module 155 may include, for example, a speaker or a receiver. The speaker may be used for general purposes, such as playing multimedia or playing record. The receiver may be used to receive an incoming call. According to an example embodiment, the receiver may be implemented separately from the speaker or as a portion of the speaker.

The display module 160 may visually provide information to the outside (e.g., a user) of the electronic device 101. The display module 160 may include, for example, a control circuit for controlling a display, a hologram device, or a projector and control circuitry to control a corresponding one of the display, the hologram device, and the projector. According to an example embodiment, the display module 160 may include a touch sensor adapted to sense a touch, or a pressure sensor adapted to measure an intensity of a force incurred by the touch.

The audio module 170 may convert a sound into an electrical signal or vice versa. According to an example embodiment, the audio module 170 may obtain the sound via the input module 150 or output the sound via the sound output module 155 or an external electronic device (e.g., an electronic device 102 such as a speaker or a headphone) directly or wirelessly connected to the electronic device 101.

The sensor module 176 may detect an operational state (e.g., power or temperature) of the electronic device 101 or an environmental state (e.g., a state of a user) external to the electronic device 101, and generate an electrical signal or data value corresponding to the detected state. According to an example embodiment, the sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. According to an example embodiment, the interface 177 may include, for example, a high-definition multimedia interface (HDMI), a universal serial bus (USB) interface, a secure digital (SD) card interface, or an audio interface.

The connecting terminal 178 may include a connector via which the electronic device 101 may be physically connected to an external electronic device (e.g., the electronic device 102). According to an example embodiment, the connecting terminal 178 may include, for example, an HDMI connector, a USB connector, an SD card connector, or an audio connector (e.g., a headphone connector).

The haptic module 179 may convert an electrical signal into a mechanical stimulus (e.g., a vibration or a movement) or an electrical stimulus which may be recognized by a user via his or her tactile sensation or kinesthetic sensation. According to an example embodiment, the haptic module 179 may include, for example, a motor, a piezoelectric element, or an electric stimulator.

The camera module 180 may capture a still image and moving images. According to an example embodiment, the camera module 180 may include one or more lenses, image sensors, ISPs, or flashes.

The power management module 188 may manage power supplied to the electronic device 101. According to an example embodiment, the power management module 188 may be implemented as, for example, at least a portion of a power management integrated circuit (PMIC).

The battery 189 may supply power to at least one component of the electronic device 101. According to an example embodiment, the battery 189 may include, for example, a primary cell which is not rechargeable, a secondary cell which is rechargeable, or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more communication processors that are operable independently of the processor 120 (e.g., an AP) and that support a direct (e.g., wired) communication or a wireless communication. According to an example embodiment, the communication module 190 may include a wireless communication module 192 (e.g., a cellular communication module, a short-range wireless communication module, or a global navigation satellite system (GNSS) communication module) or a wired communication module 194 (e.g., a local area network (LAN) communication module, or a power line communication (PLC) module). A corresponding one of these communication modules may communicate with the external electronic device 104 via the first network 198 (e.g., a short-range communication network, such as Bluetooth™, wireless-fidelity (Wi-Fi) direct, or infrared data association (IrDA)) or the second network 199 (e.g., a long-range communication network, such as a legacy cellular network, a 5 Gnetwork, a next-generation communication network, the Internet, or a computer network (e.g., a LAN or a wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5 Gnetwork after a 4G network, and next-generation communication technology, e.g., new radio (NR) access technology. The NR access technology may support enhanced mobile broadband (eMBB), massive machine type communications (mMTC), or ultra-reliable and low-latency communications (URLLC). The wireless communication module 192 may support a high-frequency band (e.g., a mmWave band) to achieve, e.g., a high data transmission rate. The wireless communication module 192 may support various technologies for securing performance on a high-frequency band, such as, e.g., beamforming, massive multiple-input and multiple-output (massive MIMO), full dimensional MIMO (FD-MIMO), an array antenna, analog beam-forming, or a large scale antenna. The wireless communication module 192 may support various requirements specified in the electronic device 101, an external electronic device (e.g., the electronic device 104), or a network system (e.g., the second network 199). According to an example embodiment, the wireless communication module 192 may support a peak data rate (e.g., 20 Gbps or more) for implementing eMBB, loss coverage (e.g., 164 dB or less) for implementing mMTC, or U-plane latency (e.g., 0.5 ms or less for each of downlink (DL) and uplink (UL), or a round trip of 1 ms or less) for implementing URLLC.

The antenna module 197 may transmit or receive a signal or power to or from the outside (e.g., the external electronic device) of the electronic device 101. According to an example embodiment, the antenna module 197 may include an antenna including a radiating element including a conductive material or a conductive pattern formed in or on a substrate (e.g., a printed circuit board (PCB)). According to an example embodiment, the antenna module 197 may include a plurality of antennas (e.g., array antennas). In such a case, at least one antenna appropriate for a communication scheme used in a communication network, such as the first network 198 or the second network 199, may be selected by, for example, the communication module 190 from the plurality of antennas. The signal or the power may be transmitted or received between the communication module 190 and the external electronic device via the at least one selected antenna. According to an example embodiment, another component (e.g., a radio frequency integrated circuit (RFIC)) other than the radiating element may be additionally formed as a portion of the antenna module 197.

According to various example embodiments, the antenna module 197 may form a mmWave antenna module. According to an example embodiment, the mmWave antenna module may include a PCB, an RFIC disposed on a first surface (e.g., a bottom surface) of the PCB or adjacent to the first surface and capable of supporting a designated high-frequency band (e.g., the mmWave band), and a plurality of antennas (e.g., array antennas) disposed on a second surface (e.g., a top or a side surface) of the PCB, or adjacent to the second surface and capable of transmitting or receiving signals in the designated high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

According to an example embodiment, commands or data may be transmitted or received between the electronic device 101 and the external electronic device 104 via the server 108 coupled with the second network 199. Each of the external electronic devices 102 or 104 may be a device of the same type as or a different type from the electronic device 101. According to an example embodiment, all or some of operations to be executed by the electronic device 101 may be executed at one or more of the external electronic devices 102, 104, and 108. For example, if the electronic device 101 needs to perform a function or a service automatically, or in response to a request from a user or another device, the electronic device 101, instead of, or in addition to, executing the function or the service, may request one or more external electronic devices to perform at least portion of the function or the service. The one or more external electronic devices receiving the request may perform the at least portion of the function or the service requested, or an additional function or an additional service related to the request, and may transfer an outcome of the performing to the electronic device 101. The electronic device 101 may provide the outcome, with or without further processing of the outcome, as at least portion of a reply to the request. To that end, a cloud computing, distributed computing, mobile edge computing (MEC), or client-server computing technology may be used, for example. The electronic device 101 may provide ultra low-latency services using, e.g., distributed computing or mobile edge computing. In another example embodiment, the external electronic device 104 may include an Internet-of-things (IoT) device. The server 108 may be an intelligent server using machine learning and/or a neural network. According to an example embodiment, the external electronic device 104 or the server 108 may be included in the second network 199. The electronic device 101 may be applied to intelligent services (e.g., smart home, smart city, smart car, or healthcare) based on 5G communication technology or IoT-related technology.

The electronic device according to various example embodiments may be one of various types of electronic devices. The electronic device may include, for example, a portable communication device (e.g., a smart phone), a computer device, a portable multimedia device, a portable medical device, a camera, a wearable device, a home appliance device, or the like. According to an example embodiment of the disclosure, the electronic device is not limited to those described above.

It should be appreciated that various example embodiments of the present disclosure and the terms used therein are not intended to limit the technological features set forth herein to particular example embodiments and include various changes, equivalents, or replacements for a corresponding example embodiment. In connection with the description of the drawings, like reference numerals may be used for similar or related components. It is to be understood that a singular form of a noun corresponding to an item may include one or more of the things, unless the relevant context clearly indicates otherwise. As used herein, "A or B", "at least one of A and B", "at least one of A or B", "A, B or C", "at least one of A, B and C", and "A, B, or C," each of which may include any one of the items listed together in the corresponding one of the phrases, or all possible combinations thereof. Terms such as "first", "second", or "first" or "second" may simply be used to distinguish the component from other components in question, and may refer to components in other aspects (e.g., importance or order) is not limited. It is to be understood that if an element (e.g., a first element) is referred to, with or without the term "operatively" or "communicatively", as "coupled with," "coupled to," "connected with," or "connected to" another element (e.g., a second element), the element may be coupled with the other element directly (e.g., wiredly), wirelessly, or via a third element.

As used in connection with various example embodiments of the disclosure, the term "module" may include a unit implemented in hardware, software, or firmware, or any combination thereof, and may interchangeably be used with other terms, for example, "logic," "logic block," "part," or "circuitry". A module may be a single integral component, or a minimum unit or part thereof, adapted to perform one or more functions. For example, according to an example embodiment, the module may be implemented in a form of an application-specific integrated circuit (ASIC).

Various example embodiments as set forth herein may be implemented as software (e.g., the program 140) including one or more instructions that are stored in a storage medium (e.g., an internal memory 136 or an external memory 138) that is readable by a machine (e.g., the electronic device 101) For example, a processor (e.g., the processor 120) of the machine (e.g., the electronic device 101) may invoke at least one of the one or more instructions stored in the storage medium, and execute it. This allows the machine to be operated to perform at least one function according to the at least one instruction invoked. The one or more instructions may include a code generated by a compiler or a code executable by an interpreter. The machine-readable storage medium may be provided in the form of a non-transitory storage medium. The "non-transitory" storage medium is a tangible device, and may not include a signal (e.g., an electromagnetic wave), but this term does not differentiate between where data is semi-permanently stored in the storage medium and where the data is temporarily stored in the storage medium.

According to an example embodiment, a method according to various example embodiments of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PlayStore™), or between two user devices (e.g., smart phones) directly. If distributed online, at least portion of the computer program product may be temporarily generated or at least temporarily stored in the machine-readable storage medium, such as memory of the manufacturer's server, a server of the application store, or a relay server.

According to various example embodiments, each component (e.g., a module or a program) of the above-described components may include a single entity or multiple entities, and some of the multiple entities may be separately disposed in different components.

According to various example embodiments, one or more of the above-described components may be omitted, or one or more other components may be added. Alternatively or additionally, a plurality of components (e.g., modules or programs) may be integrated into a single component. In such a case, according to various example embodiments, the integrated component may still perform one or more functions of each of the plurality of components in the same or similar manner as they are performed by a corresponding one of the plurality of components before the integration. According to various example embodiments, operations performed by the module, the program, or another component may be carried out sequentially, in parallel, repeatedly, or heuristically, or one or more of the operations may be executed in a different order or omitted, or one or more other operations may be added.

Figure 2A:
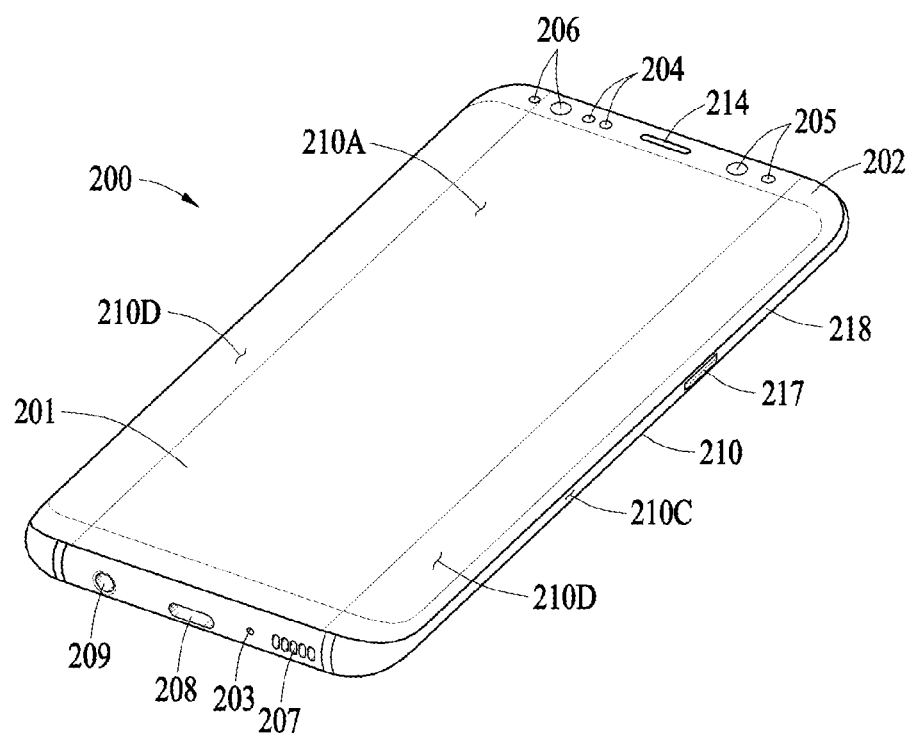
FIG. 2A is a front perspective view of a mobile electronic device according to various embodiments.
Figure 2B:
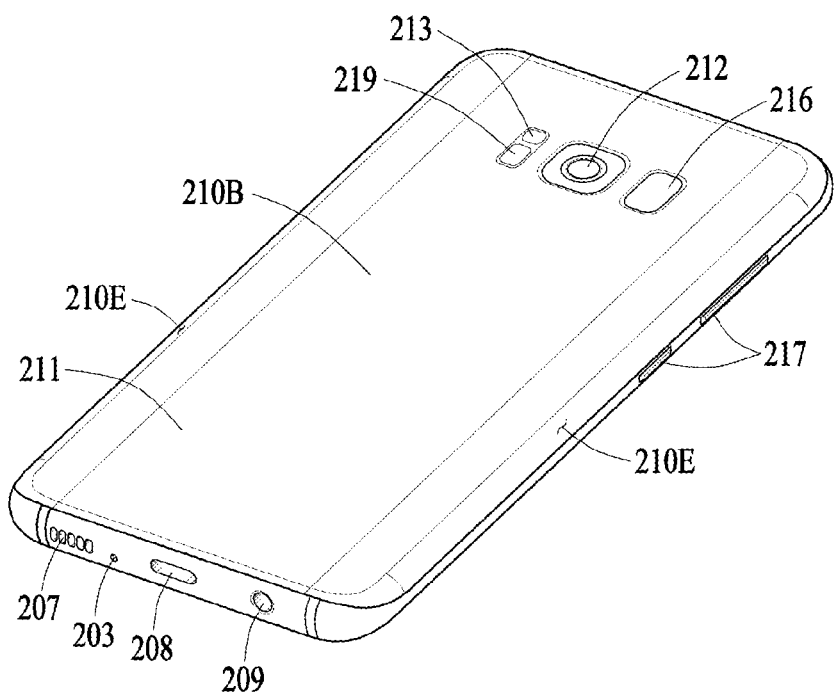
FIG. 2B is a rear perspective view of the electronic device of FIG. 2A according to various embodiments.

FIG. 2A is a front perspective view of a mobile electronic device according to various embodiments, and FIG. 2B is a rear perspective view of the electronic device of FIG. 2A according to various embodiments.

Referring to FIGS. 2A and 2B, an electronic device 200 according to an example embodiment may include a housing 210 including a first surface (or a front surface) 210A, a second surface (or a rear surface) 210B, and a side surface 210C surrounding a space between the first surface 210A and the second surface 210B. In another example embodiment (not shown), the housing may also refer to a structure which forms a portion of the first surface 210A, the second surface 210B, and the side surface 210C of FIGS. 2A and 2B. In an example embodiment, the first surface 210A may be formed of a front plate 202 (e.g., a polymer plate or a glass plate including various coating layers) of which at least a portion is substantially transparent. The second surface 210B may be formed of a back plate 211 that is substantially opaque. For example, the back plate 211 may be formed of coated or colored glass, ceramic, polymer, metal materials (e.g., aluminum, stainless steel (STS), or magnesium) or a combination of at least two of the above materials. The side surface 210C may be coupled to the front plate 202 and the back plate 211 and may be formed by a side plate (or a "side member") 218 including metal and/or polymer. In various example embodiments, the back plate 211 and the side plate 218 may be integrally formed and may include the same material (e.g., a metal material such as aluminum).

In the illustrated example embodiment, the front plate 202 may include two first areas 210D that are curved and extend seamlessly from the first surface 210A toward the back plate 211, at both ends of a long edge of the front plate 202. In the illustrated example embodiment, the back plate 211 may include two second areas 210E that are curved and extend seamlessly from the second surface 210B toward the front plate 202, at both ends of a long edge thereof. In various example embodiments, the front plate 202 (or the back plate 211) may include only one of the first areas 210D (or the second areas 210E). In another example embodiment, some of the first areas 210D or the second areas 210E may not be included. In an example embodiment, when viewed from a side surface of the electronic device 200, the side plate 218 may have a first thickness (or width) in a direction of a side surface not including the first areas 210D or the second areas 210E, and have a second thickness less than the first thickness in a direction of a side surface including the first areas 210D or the second areas 210E.

According to an example embodiment, the electronic device 200 may include at least one of a display 201, audio modules 203, 207, and 214, sensor modules 204, 216, and 219, camera modules 205, 212 (including a flash 213), key input devices 217, a light-emitting element 206, and connector holes 208 and 209. In various example embodiments, the electronic device 200 may not include at least one (e.g., the key input devices 217 or the light-emitting element 206) of the components, or may additionally include other components.

The display 201 may be visible through a substantial portion of the front plate 202, for example. In various example embodiments, at least a portion of the display 201 may be visible through the front plate 202 that forms the first surface 210A and the first areas 210D of the side surface 210C. In various example embodiments, an edge of the display 201 may be formed to be substantially the same as an adjacent outer shape of the front plate 202. In another example embodiment (not shown), in order to expand the visible area of the display 201, a distance between outer edges of the display 201 and a distance between outer edges of the front plate 202 may be substantially the same.

In another example embodiment (not shown), the electronic device 200 may have a recess or an opening formed in a portion of a screen display area of the display 201, and may include at least one of the audio module 214, the sensor module 204, the camera module 205, and the light-emitting element 206 that are aligned with the recess or the opening. In another example embodiment (not shown), the electronic device 200 may include, on a rear surface of the screen display area of the display 201, at least one of the audio module 214, the sensor module 204, the camera module 205 (e.g., an under-display camera (UDC)), the sensor module 216 (e.g., a fingerprint sensor), and the light-emitting element 206. In another example embodiment (not shown), the display 201 may be coupled to or disposed adjacent to a touch sensing circuit, a pressure sensor for measuring an intensity (pressure) of a touch, and/or a digitizer for detecting a magnetic-type stylus pen. In various example embodiments, at least a portion of the sensor modules 204 and 219, and/or at least a portion of the key input devices 217 may be disposed in the first areas 210D and/or the second areas 210E.

The audio modules 203, 207, and 214 may include a microphone hole 203, speaker holes 207 and 214, and a microphone (not shown) provided in the housing 210. The microphone hole 203 may guide a sound from the outside to the microphone. The speaker holes 207 and 214 may include an external speaker hole 207 and a receiver hole for call 214. In various example embodiments, the speaker holes 207 and 214 and the microphone hole 203 may be implemented as a single hole, or a speaker (e.g., a piezo speaker) may be included without the speaker holes 207 and 214.

The sensor modules 204, 216, and 219 may generate an electrical signal or a data value corresponding to an internal operational state of the electronic device 200 or an external environmental state. The sensor modules 204, 216, and 219 may include, for example, a first sensor module 204 (e.g., a proximity sensor) and/or a second sensor module (not shown) (e.g., a fingerprint sensor) disposed on the first surface 210A of the housing 210, and/or a third sensor module 219 (e.g., a heart rate monitoring (HRM) sensor) and/or a fourth sensor module 216 (e.g., a fingerprint sensor) disposed on the second surface 210B of the housing 210. The fingerprint sensor may be disposed on both the first surface 210A (e.g., the display 201) and the second surface 210B of the housing 210. The electronic device 200 may further include at least one of sensor modules (not shown), for example, a gesture sensor, a gyro sensor, an atmospheric pressure sensor, a magnetic sensor, an acceleration sensor, a grip sensor, a color sensor, an infrared (IR) sensor, a biometric sensor, a temperature sensor, a humidity sensor, or an illuminance sensor.

The camera modules 205, 212 (including a flash 213) may include a first camera module 205 disposed on the first surface 210A of the electronic device 200, a second camera module 212 disposed on the second surface 210B, and/or a flash 213. The camera modules 205 and 212 may each include one or more lenses, an image sensor, and/or an image signal processor. A flash 213 may include, for example, a light-emitting diode (LED) or a xenon lamp. In various example embodiments, two or more lenses (e.g., infrared camera, wide-n) angle, and telephoto lenses) and image sensors may be disposed on one surface of the electronic device 200.

The key input devices 217 may be disposed on the side surface 210C of the housing 210. In another example embodiment, the electronic device 200 may not include a portion or entirety of the key input devices 217 mentioned above, and the key input device 217 that is not included may be implemented in another form such as a soft key on the display 201. In various example embodiments, the key input devices 217 may include the sensor module 216 disposed on the second surface 210B of the housing 210.

The light-emitting element 206 may be disposed on, for example, the first surface 210A of the housing 210. The light-emitting element 206 may provide, for example, state information of the electronic device 200 in the form of light. In another example embodiment, the light-emitting element 206 may provide, for example, a light source that is linked to the operation of the camera module 205. The light-emitting element 206 may include, for example, an LED, an IR LED, and a xenon lamp.

The connector holes 208 and 209 may include a connector hole 208 for accommodating a connector (e.g., a universal serial bus (USB) connector) for transmitting and receiving power and/or data to and from an external electronic device, and/or a connector hole (e.g., an earphone jack) 209 for accommodating a connector for transmitting and receiving audio signals to and from an external electronic device.

Figure 3A:
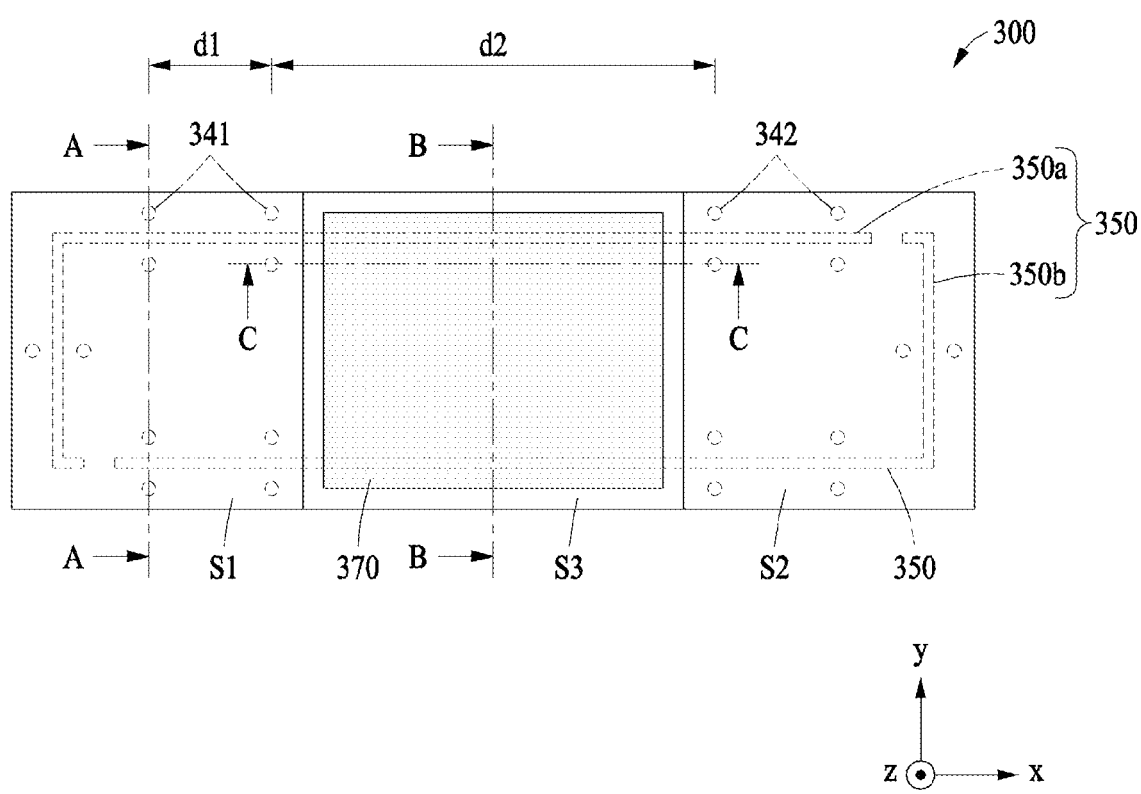
FIG. 3A is a diagram illustrating an RFPCB according to various embodiments.
Figure 3B:
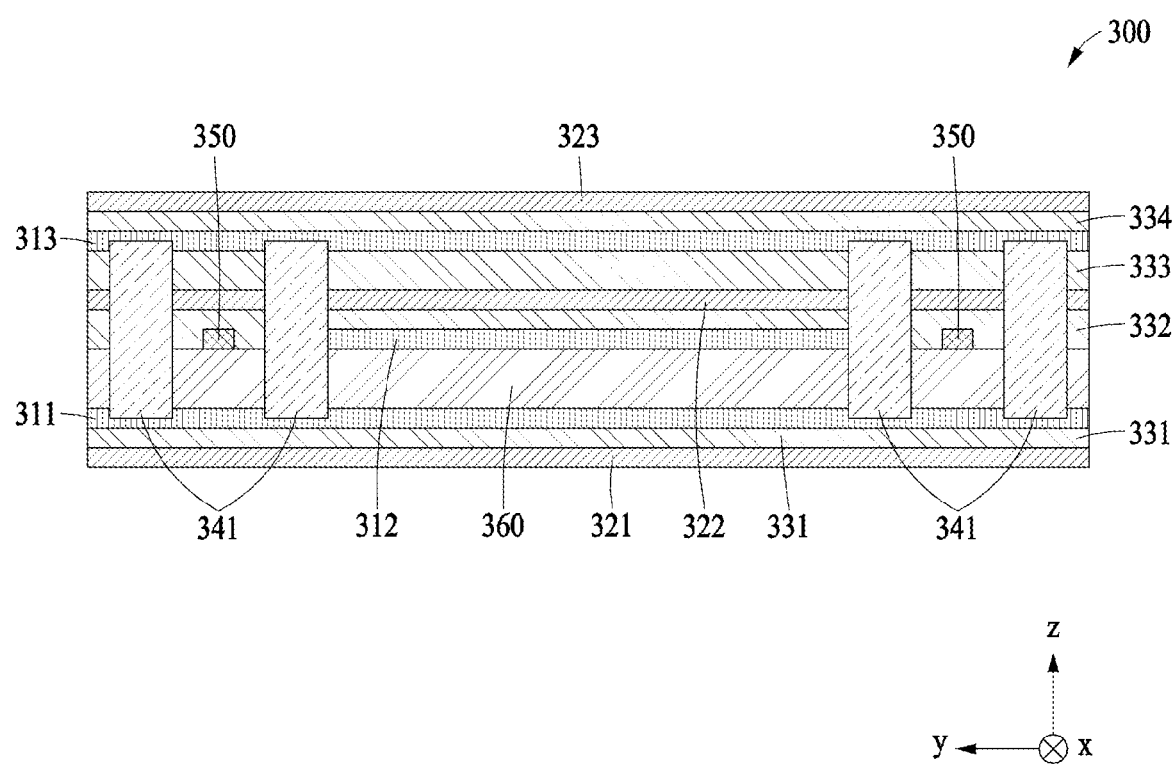
FIG. 3B is a cross-sectional view illustrating the RFPCB of FIG. 3A, taken along a line A-A according to various embodiments.
Figure 3C:
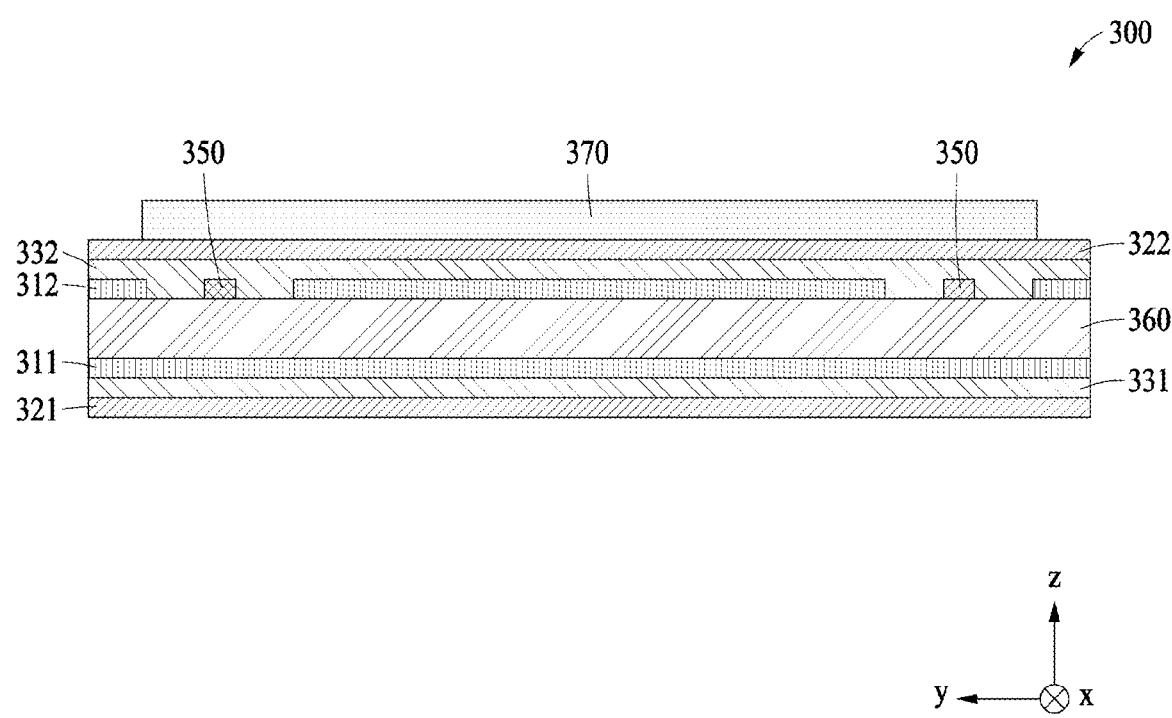
FIG. 3C is a cross-sectional view illustrating the RFPCB of FIG. 3A, taken along a line B-B according to various embodiments.
Figure 3D:
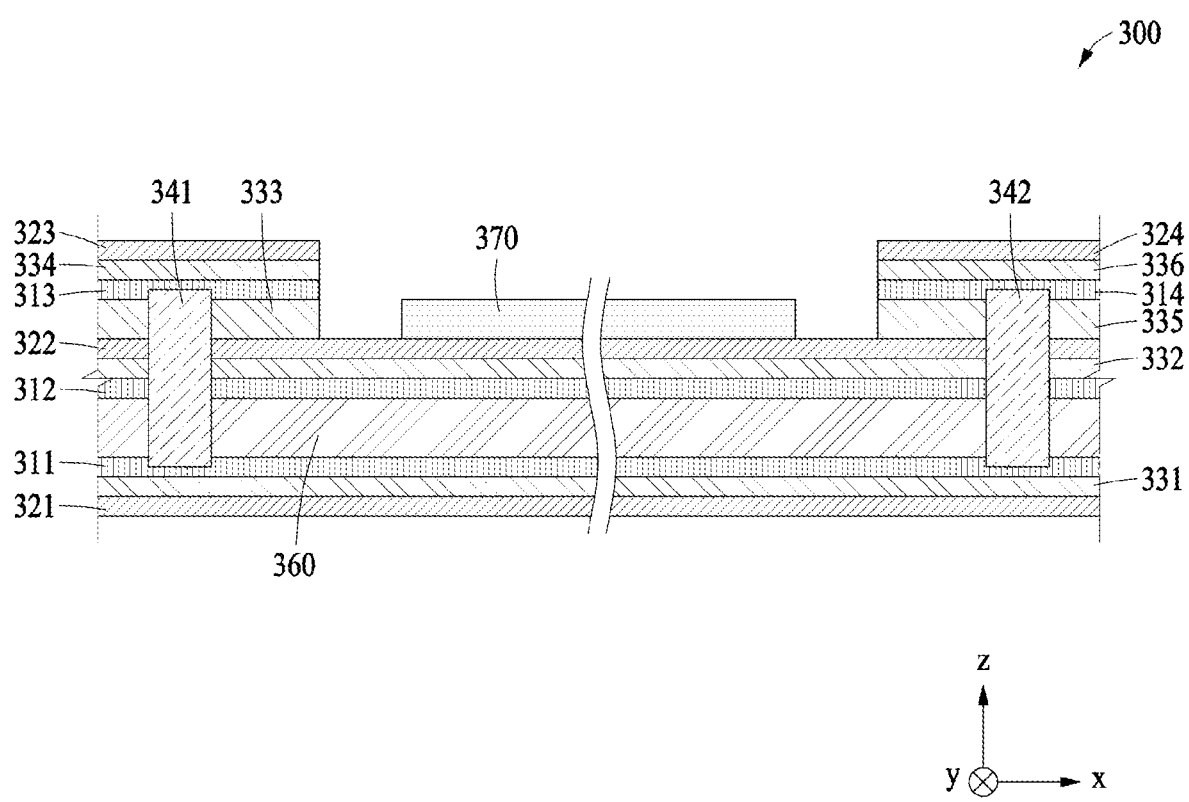
FIG. 3D is a cross-sectional view illustrating the RFPCB of FIG. 3A, taken along a line C-C according to various embodiments.

FIG. 3A is a diagram illustrating an RFPCB according to various embodiments. FIG. 3B is a cross-sectional view illustrating the RFPCB of FIG. 3A, taken along a line A-A according to various embodiments. FIG. 3C is a cross-sectional view illustrating the RFPCB of FIG. 3A, taken along a line B-B according to various embodiments. FIG. 3D is a cross-sectional view illustrating the RFPCB of FIG. 3A, taken along a line C-C according to various embodiments.

Referring to FIGS. 3A, 3B, 3C and 3D (which may be referred to as FIGS. 3A to 3D), in an example embodiment, an electronic device (e.g., the electronic device 101 of FIG. 1, the electronic device 200 of FIG. 2A) may include an RFPCB 300. The RFPCB 300 may include a plurality of layers stacked in a first direction, for example, a z-axial direction. The RFPCB 300 may include a first rigid portion S1, a second rigid portion S2, and a flexible portion S3 positioned between the first rigid portion S1 and the second rigid portion S2. The flexible portion S3 may be relatively easily deformed by an external force, compared to the rigid portions S1 and S2.

In an example embodiment, the RFPCB 300 may include a plurality of conductive layers 311, 312, 313, and 314. The RFPCB 300 may include a first base conductive layer 311 and a second base conductive layer 312 spaced apart from each other in a first direction, a first rigid conductive layer 313 spaced apart from the first base conductive layer 311 in the first direction, and a second rigid conductive layer 314 spaced apart from the first base conductive layer 311 in the first direction and spaced apart from the first rigid conductive layer 313 in a second direction, for example, an x-axial direction. At least a portion of the plurality of conductive layers 311, 312, 313, and 314 of the RFPCB 300 may include a ground plane (or a ground layer). The ground plane may shield or reduce electromagnetic noise to a flow of signals or power.

In an example embodiment, the RFPCB 300 may include a plurality of cover layers 321, 322, 323, and 324. The RFPCB 300 may include a bottom cover layer 321 for covering the first base conductive layer 311, a base cover layer 322 for covering the second base conductive layer 312, a first rigid cover layer 323 for covering the first rigid conductive layer 313, and a second rigid cover layer 324 for covering the second rigid conductive layer 314.

In an example embodiment, the RFPCB 300 may include a plurality of adhesive layers 331, 332, 333, 334, 335, and 336. The RFPCB 300 may include a first base adhesive layer 331 connecting the bottom cover layer 321 and the first base conductive layer 311, a second base adhesive layer 332 connecting the second base conductive layer 312 and the base cover layer 322, a first rigid adhesive layer 333 connecting the base cover layer 322 and the first rigid conductive layer 313, a second rigid adhesive layer 334 connecting the first rigid conductive layer 313 and the first rigid cover layer 323, a third rigid adhesive layer 335 connecting the base cover layer 322 and the second rigid conductive layer 314, and a fourth rigid adhesive layer 336 connecting the second rigid conductive layer 314 and the second rigid cover layer 324.

In an example embodiment, the RFPCB 300 may include a plurality of first conductive vias 341 provided in the first rigid portion S1 to connect the first base conductive layer 311 and the first rigid conductive layer 313, and a plurality of second conductive vias 342 provided in the second rigid portion S2 to connect the first base conductive layer 311 and the second rigid conductive layer 314.

In an example embodiment, the RFPCB 300 may include a transmission line (e.g., an RF line) 350 provided between the first base conductive layer 311 and the base cover layer 322. The transmission line 350 may be disposed in a circumferential direction of the RFPCB 300. A portion of the transmission line 350 may be positioned in the flexible portion S3, and another portion thereof may be positioned in the rigid portions S1 and S2. The second base conductive layer 312 may be spaced apart from the transmission line 350. The transmission line 350 may include two transmission parts 350a and 350b that are separated from each other. The two transmission parts 350a and 350b may include a first transmission part 350a and a second transmission part 350b. One end of the first transmission part 350a may be positioned in the first rigid portion S1, and the other end thereof may be positioned in the second rigid portion S2. One end of the second transmission part 350b may be positioned in the first rigid portion S1, and the other end thereof may be positioned in the second rigid portion S2. Terminals (not shown) may be connected to both ends of each of the two transmission parts 350a and 350b.

In an example embodiment, the RFPCB 300 may include a dielectric 360 positioned between the first base conductive layer 311 and the second base conductive layer 312.

In an example embodiment, the RFPCB 300 may include a dummy metal layer 370 disposed on one surface of the base cover layer 322. The dummy metal layer 370 may be positioned between the first rigid conductive layer 313 and the second rigid conductive layer 314. The dummy metal layer 370 may be spaced apart from the first rigid conductive layer 313 and the second rigid conductive layer 314 in the second direction, for example, the x-axial direction. For example, the dummy metal layer 370 may be spaced apart from the first rigid conductive layer 313 in a +x direction and spaced apart from the second rigid conductive layer 314 in a −x direction. The dummy metal layer 370 may overlap the transmission line 350 in the first direction, for example, the z-axial direction.

In an example embodiment, the dummy metal layer 370 may be secured to the base cover layer 322. For example, the dummy metal layer 370 may be adhered and/or welded to the base cover layer 322. The dummy metal layer 370 may be integrally deformable with the base cover layer 322. Herein, being integrally deformed refers to being deformed together as one body.

In an example embodiment, a thickness of the dummy metal layer 370 in the first direction may be less than or equal to a maximum distance from the base cover layer 322 to the first rigid conductive layer 313 in the first direction, for example, the z-axial direction. For example, the thickness of the dummy metal layer 370 may be less than or equal to a distance from a contact surface between the dummy metal layer 370 and the base cover layer 322 to a top surface of the first rigid conductive layer 313 in the first direction. The dummy metal layer 370 may not overlap the first rigid conductive layer 313 in the first direction, for example, the z-axial direction. When the dummy metal layer 370 and the first rigid conductive layer 313 overlap, the dummy metal layer 370 and the first rigid conductive layer 313 may be recognized as one body, and a resonance enhancing effect of the dummy metal layer 370 may be reduced or eliminated.

In an example embodiment, the dummy metal layer 370 may be positioned between the first conductive vias 341 and the second conductive vias 342 and spaced apart from the first conductive vias 341 and the second conductive vias 342.

In an example embodiment, a resonant frequency of the transmission line 350 may be determined by a distance between two adjacent conductive vias provided in a longitudinal direction of the transmission line 350. For example, when the distance between two adjacent conductive vias increases, the resonant frequency of the transmission line 350 may decrease. For example, since a plurality of conductive vias may be disposed in the first rigid portion S1 and the second rigid portion S2, the resonant frequency of the transmission line 350 in the portions may be formed sufficiently high. Here, the resonant frequency being sufficiently high may indicate that the resonant frequency may be formed at a value exceeding a frequency band to be implemented through the RFPCB 300 and thus, have no adverse effects on the performance of the RFPCB 300.

In an example embodiment, a smaller number of conductive vias may be provided in the flexible portion S3, than in the rigid portions S1 and S2. Although it is illustrated that no conductive via is provided in the flexible portion S3 in the drawings, a smaller number of conductive vias may be provided in the flexible portion S3, than in the rigid portions S1 and S2.

In an example embodiment, for example, a distance d1 between two adjacent first conductive vias of the plurality of first conductive vias 341 may be less than a distance d2 between the first conductive vias 341 and the second conductive vias 342. For example, the distance d1 between two adjacent first conductive vias of the plurality of first conductive vias 341 may be less than a distance between the first rigid conductive layer 313 and the second rigid conductive layer 314.

In an example embodiment, the RFPCB 300 may improve the resonance of the transmission line 350 in the flexible portion S3 through the metal dummy layer 370 disposed on the base cover layer 322. The metal dummy layer 370 may serve similar to the first conductive vias 341 and the second conductive vias 342, on the flexible portion S3. A distance between the metal dummy layer 370 and the first conductive vias 341 and/or a distance between the metal dummy layer 370 and the second conductive vias 342 may be less than or substantially similar to a distance between two adjacent first conductive vias or a distance between two adjacent second conductive vias.

Figure 4:
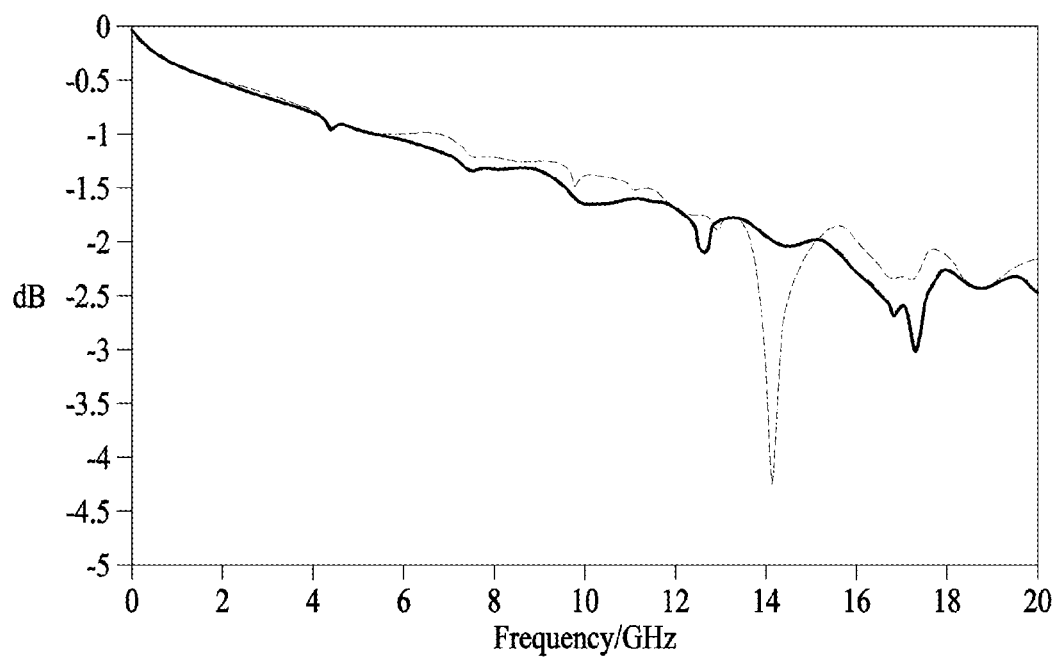
FIG. 4 is a graph illustrating the elimination of resonance in a target frequency range by providing a dummy metal layer according to various embodiments.

FIG. 4 is a graph illustrating the elimination/reduction of resonance in a target frequency range by providing a dummy metal layer according to various embodiments.

In FIG. 4, a solid curve indicates a frequency-to-decibel value in an RFPCB (e.g., the RFPCB 300 of FIGS. 3A to 3D, an RFPCB 500 of FIG. 5, an RFPCB 600 of FIG. 6, or an RFPCB 700 of FIG. 7) including a dummy metal layer, and a broken curve indicates a frequency-to-decibel value in a state in which the dummy metal layer is removed from the RFPCB.

Referring to FIG. 4, it may be shown that in a state in which the dummy metal layer is not provided, resonance occurs in the vicinity of about 14 gigahertz (GHz). Conversely, it may be shown that when the dummy metal layer is provided, the resonant frequency is formed to be a value greater than 14 GHz and is not observed in the present graph as exceeding 20 GHz.

Figure 5:
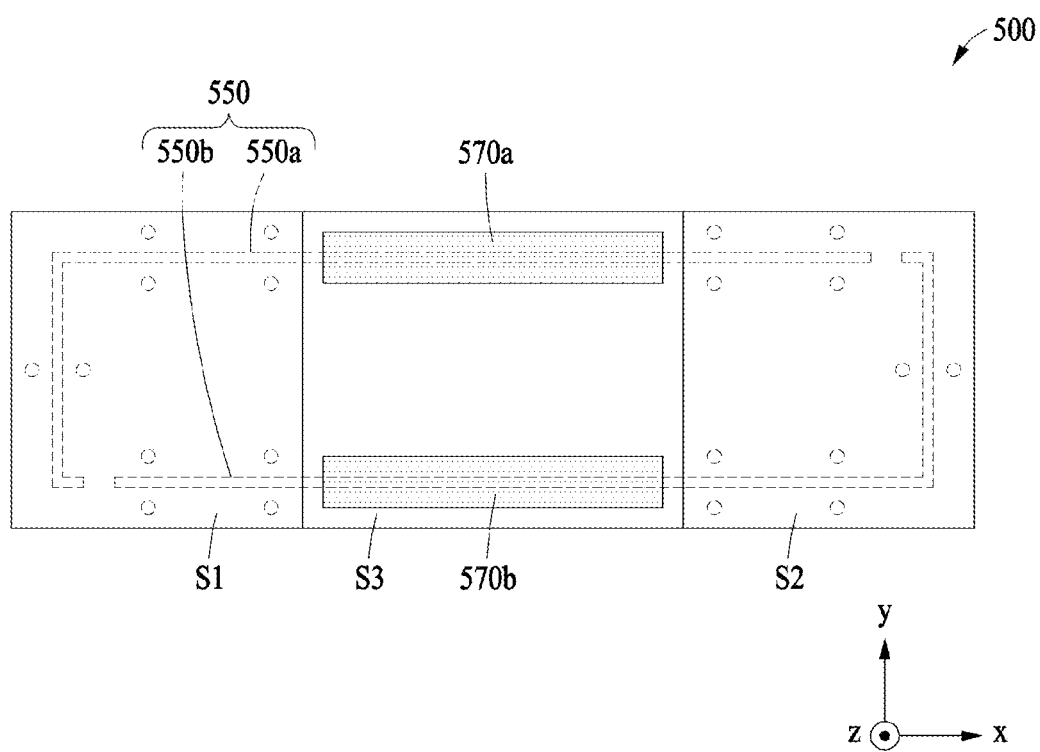
FIG. 5 is a diagram illustrating an RFPCB according to various embodiments.

FIG. 5 is a diagram illustrating an RFPCB according to various embodiments.

Referring to FIG. 5, in an example embodiment, the RFPCB 500 may include a first rigid portion S1 and a second rigid portion S2 provided to be spaced apart from each other, and a flexible portion S3 provided between the first rigid portion S1 and the second rigid portion S2. The RFPCB 500 may include a transmission line 550, a portion of which is positioned in the rigid portions S1 and S2 and the other portion of which is positioned in the flexible portion S3. The RFPCB 500 may include dummy metal layers 570a and 570b overlapping the transmission line 550 in a first direction, for example, a z-axial direction. The dummy metal layers 570a and 570b may be spaced apart from the rigid portions S1 and S2 in a second direction, for example, an x-axial direction.

In an example embodiment, the transmission line 550 may include a first transmission part 550a and a second transmission part 550b spaced apart from each other in a third direction, for example, a y-axial direction.

In an example embodiment, the dummy metal layers 570a and 570b may include a first dummy part 570a overlapping the first transmission part 550a and a second dummy part 570b overlapping the second transmission part 550b. A resonant frequency may vary according to the size of each of the first dummy part 570a and the second dummy part 570b. For example, when the first dummy part 570a and the second dummy part 570b are integrally formed (e.g., the dummy metal layer 370 of FIGS. 3A to 3D), an area of the dummy metal layer may be formed relatively large. In this case, the dummy metal layer may possibly receive energy of a signal generated by the transmission line 550 and radiate the energy to the outside. Since the first dummy part 570a and the second dummy part 570b have shapes that are separated from each other, each may have a relatively small area, compared to the integrally formed dummy metal layer (e.g., the dummy metal layer 370 of FIGS. 3A to 3D). By dividing the dummy metal layers 570a and 570b into the first dummy part 570a and the second dummy part 570b having relatively small areas, it is possible to prevent the dummy metal layers 570a and 570b from serving as antennas.

Figure 6:
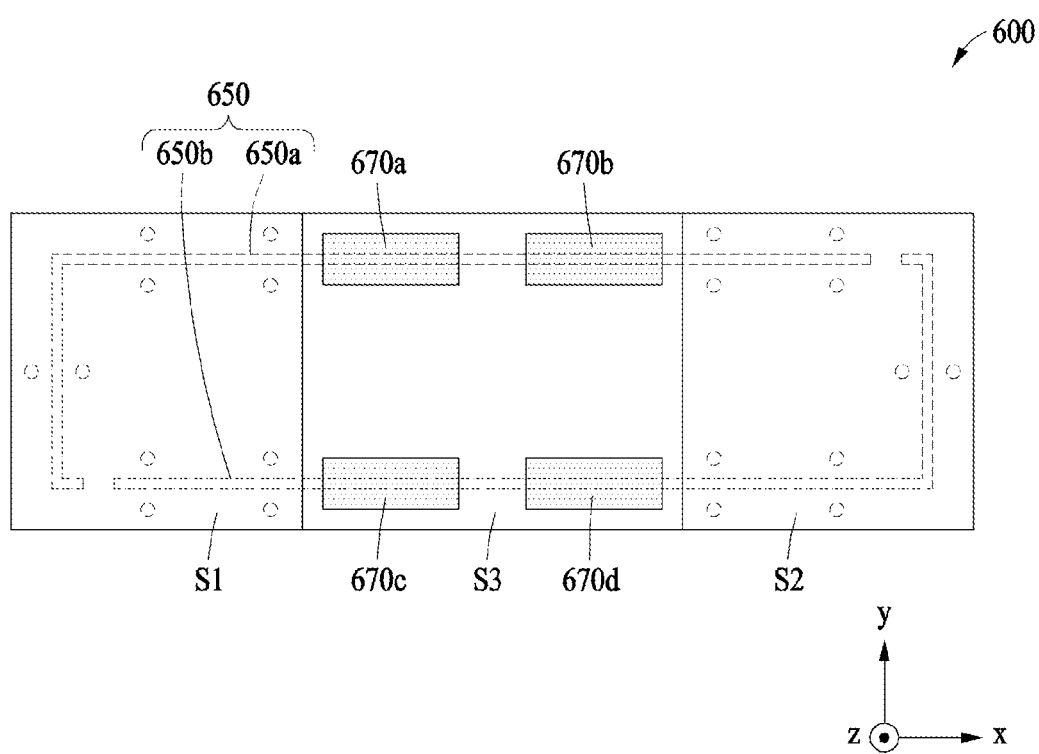
FIG. 6 is a diagram illustrating an RFPCB according to various embodiments.

FIG. 6 is a diagram illustrating an RFPCB according to various embodiments.

Referring to FIG. 6, in an example embodiment, the RFPCB 600 may include a first rigid portion S1 and a second rigid portion S2 provided to be spaced apart from each other, and a flexible portion S3 provided between the first rigid portion S1 and the second rigid portion S2. The RFPCB 600 may include a transmission line 650, a portion of which is positioned in the rigid portions S1 and S2 and the other portion of which is positioned in the flexible portion S3. The RFPCB 600 may include dummy metal layers 670a, 670b, 670c, and 670d overlapping the transmission line 650 in a first direction, for example, a z-axial direction. The dummy metal layers 670a, 670b, 670c, and 670d may be spaced apart from the rigid portions S1 and S2 in a second direction, for example, an x-axial direction.

In an example embodiment, the transmission line 650 may include a first transmission part 650a and a second transmission part 650b spaced apart from each other in a third direction, for example, a y-axial direction.

In an example embodiment, the dummy metal layers 670a, 670b, 670c, and 670d may include a first dummy part 670a and a second dummy part 670b overlapping the first transmission part 650a, and a third dummy part 670c and a fourth dummy part 670d overlapping the second transmission part 650b. The first dummy part 670a and the second dummy part 670b may be spaced apart from each other in the first direction, for example, the x-axial direction. The third dummy part 670c and the fourth dummy part 670d may be spaced apart from each other in the first direction, for example, the x-axial direction.

Figure 7:
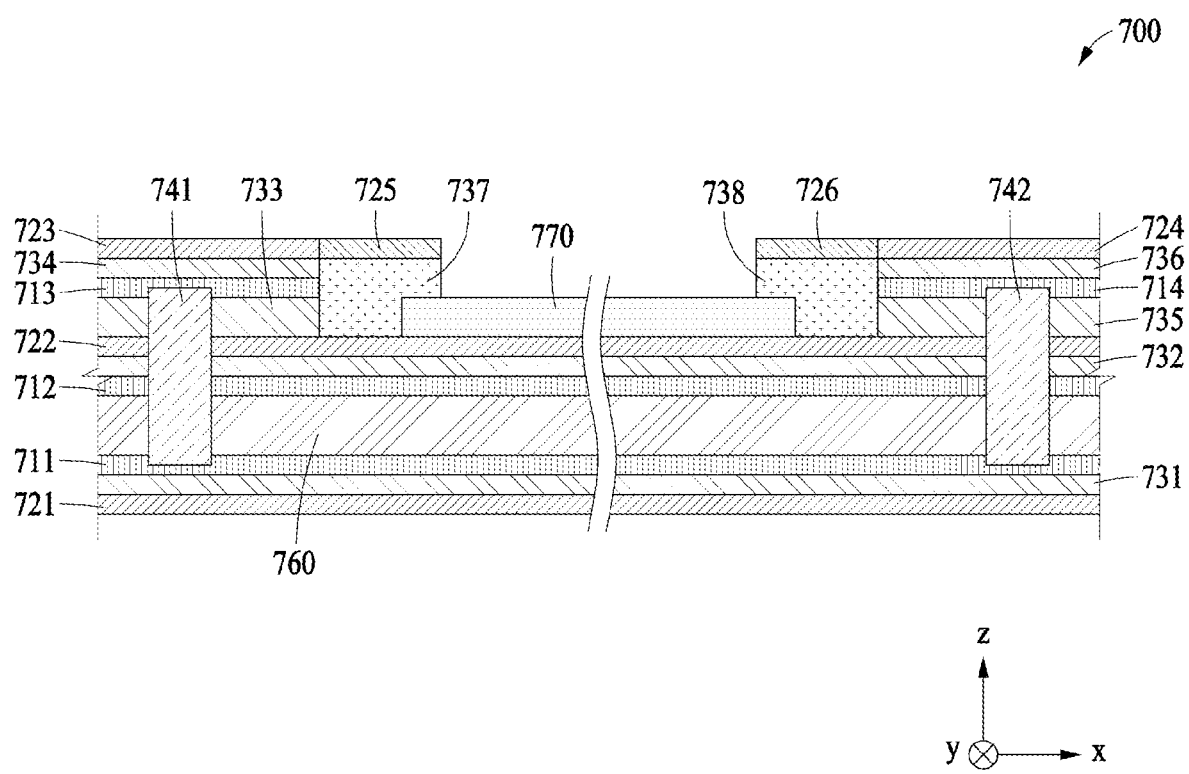
FIG. 7 is a cross-sectional view illustrating an RFPCB according to various embodiments.

FIG. 7 is a cross-sectional view illustrating an RFPCB according to various embodiments.

Referring to FIG. 7, in an example embodiment, the RFPCB 700 may include a plurality of conductive layers 711, 712, 713, and 714 (e.g., the plurality of conductive layers 311, 312, 313, and 314 of FIGS. 3A to 3D), a plurality of cover layers 721, 722, 723, and 724 (e.g., the plurality of cover layers 321, 322, 323, and 324 of FIGS. 3A to 3D), a plurality of adhesives layers 731, 732, 733, 734, 735, and 736 (e.g., the plurality of adhesive layers 331, 332, 333, 334, 335, and 336 of FIGS. 3A to 3D), a plurality of conductive vias 741 and 742 (e.g., the first conductive vias 341 and the second conductive vias 342 of FIGS. 3A to 3D), a transmission line (not shown) (e.g., the transmission line 350 of FIGS. 3A to 3D), a dielectric 760, and a dummy metal layer 770.

In an example embodiment, the RFPCB 700 may include a first overlap cover layer 725 extending from the first rigid cover layer 723 and overlapping the dummy metal layer 770 in a first direction, for example, a z-axial direction. For example, the first overlap cover layer 725 may be integrally formed with the first rigid cover layer 723. The first overlap cover layer 725 may cover a relatively large stepped portion between a rigid portion and a flexible portion (e.g., a stepped portion between the first rigid cover layer 723 and the base cover layer 722), thereby improving the structural stability. The RFPCB 700 may include a second overlap cover layer 726 extending from the second rigid cover layer 724 and overlapping the dummy metal layer 770 in the first direction, for example, the z-axial direction.

In an example embodiment, the RFPCB 700 may include a first overlap adhesive layer 737 formed to fill a space between the first overlap cover layer 725 and the base cover layer 722 and connected to the dummy metal layer 770. The first overlap adhesive layer 737 may cover an end portion of the dummy metal layer 770 in a −x direction, thereby improving the coupling stability of the dummy metal layer 770. The RFPCB 700 may include a second overlap adhesive layer 738 formed to fill a space between the second overlap cover layer 726 and the base cover layer 722 and connected to the dummy metal layer 770. The second overlap adhesive layer 738 may cover an end portion of the dummy metal layer 770 in a +x direction, thereby improving the coupling stability of the dummy metal layer 770.

In an example embodiment, the RFPCB 700 (e.g., the RFPCB 300 of FIGS. 3A to 3D) may be provided in an "L" shape in an electronic device (e.g., the electronic device 200 of FIG. 2A). For example, a portion of the RFPCB 700 may be connected to an antenna that is mounted horizontally in the electronic device (e.g., the electronic device 200 of FIG. 2A), and another portion thereof may be connected to an antenna that is mounted vertically in the electronic device (e.g., the electronic device 200 of FIG. 2A). For example, the RFPCB 700 may include a plurality of rigid portions (e.g., the first rigid portion S1 and the second rigid portion S2 of FIGS. 3A to 3D) connected to an antenna, and a flexible portion (e.g., the flexible portion S3 of FIGS. 3A to 3D) provided between the plurality of rigid portions in a curved shape.

In an example embodiment, the RFPCB 700 (e.g., the RFPCB 300 of FIGS. 3A to 3D) may be connected to an antenna secured to one surface of a display (e.g., the display 201 of FIG. 2A). For example, the RFPCB 700 may be connected to an antenna on the display. For example, a portion of the RFPCB 700 may be connected to an antenna secured to the display, and another portion thereof may be connected to a PCB spaced from the antenna.

According to various example embodiments, an electronic device may include a rigid flexible printed circuit board (RFPCB), wherein the RFPCB may include: a first base conductive layer; a first rigid conductive layer spaced apart from the first base conductive layer in a first direction; a second rigid conductive layer spaced apart from the first base conductive layer in the first direction and spaced apart from the first rigid conductive layer in a second direction intersecting the first direction; a base cover layer spaced apart from the first base conductive layer in the first direction and positioned closer to the first base conductive layer than to the first rigid conductive layer and the second rigid conductive layer; a transmission line positioned between the first base conductive layer and the base cover layer; and a dummy metal layer disposed on the base cover layer, positioned between the first rigid conductive layer and the second rigid conductive layer, and overlapping the transmission line in the first direction.

In various example embodiments, the dummy metal layer may be spaced apart from the first rigid conductive layer and the second rigid conductive layer in the second direction.

In various example embodiments, the dummy metal layer may be integrally deformable with the base cover layer.

In various example embodiments, a thickness of the dummy metal layer in the first direction may be less than or equal to a maximum distance from the base cover layer to the first rigid conductive layer in the first direction.

In various example embodiments, the RFPCB may further include: a plurality of first conductive vias connecting the first base conductive layer and the first rigid conductive layer; and a plurality of second conductive vias connecting the first base conductive layer and the second rigid conductive layer.

In various example embodiments, the dummy metal layer may be positioned between the first conductive vias and the second conductive vias and spaced apart from the first conductive vias and the second conductive vias.

In various example embodiments, a distance between two adjacent first conductive vias of the plurality of first conductive vias may be less than a distance between the first conductive vias and the second conductive vias.

In various example embodiments, a distance between two adjacent first conductive vias of the plurality of first conductive vias may be less than a distance between the first rigid conductive layer and the second rigid conductive layer.

In various example embodiments, the RFPCB may further include a second base conductive layer positioned between the first base conductive layer and the base cover layer and spaced apart from the transmission line.

In various example embodiments, the RFPCB may further include a first rigid adhesive layer disposed in a space between the base cover layer and the first rigid conductive layer and spaced apart from the dummy metal layer.

In various example embodiments, the transmission line may include a first transmission part and a second transmission part that are spaced apart from each other in a third direction intersecting the first direction and the second direction, and the dummy metal layer may include a first dummy part and a second dummy part that overlap the first transmission part and the second transmission part, respectively, in the first direction.

In various example embodiments, the dummy metal layer may include a plurality of dummy parts spaced apart from each other in the first direction.

In various example embodiments, the RFPCB may further include: a first rigid cover layer overlapping the first rigid conductive layer in the first direction.

In various example embodiments, the RFPCB may further include: an overlap cover layer extending from the first rigid cover layer and overlapping the dummy metal layer in the first direction.

In various example embodiments, the RFPCB may further include: an overlap adhesive layer disposed in a space between the overlap cover layer and the base cover layer and connected to the dummy metal layer.

According to various example embodiments, an RFPCB may include: a first base conductive layer; a first rigid conductive layer spaced apart from the first base conductive layer in a first direction; a second rigid conductive layer spaced apart from the first base conductive layer in the first direction and spaced apart from the first rigid conductive layer in a second direction intersecting the first direction; a base cover layer spaced apart from the first base conductive layer in the first direction and positioned closer to the first base conductive layer than to the first rigid conductive layer and the second rigid conductive layer; a transmission line positioned between the first base conductive layer and the base cover layer; and a dummy metal layer disposed on the base cover layer, positioned between the first rigid conductive layer and the second rigid conductive layer, and overlapping the transmission line in the first direction.

In various example embodiments, the dummy metal layer may be spaced apart from the first rigid conductive layer and the second rigid conductive layer in the second direction.

In various example embodiments, the dummy metal layer may be integrally deformable with the base cover layer.

In various example embodiments, the transmission line may include a first transmission part and a second transmission part spaced apart from each other in a third direction intersecting the first direction and the second direction, and the dummy metal layer may include a first dummy part and a second dummy part that overlap the first transmission part and the second transmission part, respectively, in the first direction.

According to various example embodiments, an electronic device may include a rigid flexible printed circuit board (RFPCB), wherein the RFPCB may include: a first base conductive layer; a second base conductive layer spaced apart from the first base conductive layer in a first direction; a dielectric positioned between the first base conductive layer and the second base conductive layer; a first rigid conductive layer positioned on an opposite side of the first base conductive layer with respect to the second base conductive layer; a second rigid conductive layer spaced apart from the first rigid conductive layer in a second direction intersecting the first direction; a base cover layer spaced apart from the first base conductive layer in the first direction and positioned closer to the first base conductive layer than to the first rigid conductive layer and the second rigid conductive layer; a transmission line positioned between the first base conductive layer and the base cover layer; a plurality of first conductive vias connecting the first base conductive layer and the first rigid conductive layer; a plurality of second conductive vias connecting the second base conductive layer and the second rigid conductive layer; and a dummy metal layer positioned between the first rigid conductive layer and the second rigid conductive layer, positioned between the first conductive vias and the second conductive vias, and overlapping the transmission line in the first direction.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising a rigid flexible printed circuit board (RFPCB), wherein the RFPCB comprises:
    a first base conductive layer;
    a first rigid conductive layer spaced apart from the first base conductive layer in a first direction;
    a second rigid conductive layer spaced apart from the first base conductive layer in the first direction and spaced apart from the first rigid conductive layer in a second direction intersecting the first direction;
    a base cover layer spaced apart from the first base conductive layer in the first direction and positioned closer to the first base conductive layer than to the first rigid conductive layer and the second rigid conductive layer;
    a transmission line positioned between the first base conductive layer and the base cover layer; and
    a dummy metal layer disposed on the base cover layer, positioned between the first rigid conductive layer and the second rigid conductive layer, and overlapping the transmission line in the first direction.

2. The electronic device of claim 1, wherein the dummy metal layer is spaced apart from the first rigid conductive layer and the second rigid conductive layer in the second direction.

3. The electronic device of claim 1, wherein the dummy metal layer is integrally deformable with the base cover layer.

4. The electronic device of claim 1, wherein a thickness of the dummy metal layer in the first direction is less than or equal to a maximum distance from the base cover layer to the first rigid conductive layer in the first direction.

5. The electronic device of claim 1, wherein the RFPCB further comprises:
    a plurality of first conductive vias connecting the first base conductive layer and the first rigid conductive layer; and
    a plurality of second conductive vias connecting the first base conductive layer and the second rigid conductive layer.

6. The electronic device of claim 5, wherein the dummy metal layer is positioned between the first conductive vias and the second conductive vias and spaced apart from the first conductive vias and the second conductive vias.

7. The electronic device of claim 5, wherein a distance between two adjacent first conductive vias of the plurality of first conductive vias is less than a distance between the first conductive vias and the second conductive vias.

8. The electronic device of claim 5, wherein a distance between two adjacent first conductive vias of the plurality of first conductive vias is less than a distance between the first rigid conductive layer and the second rigid conductive layer.

9. The electronic device of claim 1, wherein the RFPCB further comprises:
    a second base conductive layer positioned between the first base conductive layer and the base cover layer and spaced apart from the transmission line.

10. The electronic device of claim 1, wherein the RFPCB further comprises:
    a first rigid adhesive layer disposed in a space between the base cover layer and the first rigid conductive layer and spaced apart from the dummy metal layer.

11. The electronic device of claim 1, wherein the transmission line comprises a first transmission part and a second transmission part spaced apart from each other in a third direction intersecting the first direction and the second direction, and
    the dummy metal layer comprises a first dummy part and a second dummy part that overlap the first transmission part and the second transmission part, respectively, in the first direction.

12. The electronic device of claim 1, wherein the dummy metal layer comprises a plurality of dummy parts spaced apart from each other in the first direction.

13. The electronic device of claim 1, wherein the RFPCB further comprises:
    a first rigid cover layer overlapping the first rigid conductive layer in the first direction.

14. The electronic device of claim 13, wherein the RFPCB further comprises:
    an overlap cover layer extending from the first rigid cover layer and overlapping the dummy metal layer in the first direction.

15. The electronic device of claim 14, wherein the RFPCB further comprises:
    an overlap adhesive layer disposed in a space between the overlap cover layer and the base cover layer and connected to the dummy metal layer.

16. A rigid flexible printed circuit board (RFPCB), comprising:
    a first base conductive layer;

a first rigid conductive layer spaced apart from the first base conductive layer in a first direction;

a second rigid conductive layer spaced apart from the first base conductive layer in the first direction and spaced apart from the first rigid conductive layer in a second direction intersecting the first direction;

a base cover layer spaced apart from the first base conductive layer in the first direction and positioned closer to the first base conductive layer than to the first rigid conductive layer and the second rigid conductive layer;

a transmission line positioned between the first base conductive layer and the base cover layer; and a dummy metal layer disposed on the base cover layer, positioned between the first rigid conductive layer and the second rigid conductive layer, and overlapping the transmission line in the first direction.

17. The RFPCB of claim 16, wherein the dummy metal layer is spaced apart from the first rigid conductive layer and the second rigid conductive layer in the second direction.

18. The RFPCB of claim 16, wherein the dummy metal layer is integrally deformable with the base cover layer.

19. The RFPCB of claim 16, wherein the transmission line comprises a first transmission part and a second transmission part spaced apart from each other in a third direction intersecting the first direction and the second direction, and
the dummy metal layer comprises a first dummy part and a second dummy part that overlap the first transmission part and the second transmission part, respectively, in the first direction.

20. An electronic device comprising a rigid flexible printed circuit board (RFPCB), wherein the RFPCB comprises:

a first base conductive layer;

a second base conductive layer spaced apart from the first base conductive layer in a first direction;

a dielectric positioned between the first base conductive layer and the second base conductive layer;

a first rigid conductive layer positioned on an opposite side of the first base conductive layer with respect to the second base conductive layer;

a second rigid conductive layer spaced apart from the first rigid conductive layer in a second direction intersecting the first direction;

a base cover layer spaced apart from the first base conductive layer in the first direction and positioned closer to the first base conductive layer than to the first rigid conductive layer and the second rigid conductive layer;

a transmission line positioned between the first base conductive layer and the base cover layer;

a plurality of first conductive vias connecting the first base conductive layer and the first rigid conductive layer;

a plurality of second conductive vias connecting the second base conductive layer and the second rigid conductive layer; and a dummy metal layer positioned between the first rigid conductive layer and the second rigid conductive layer, positioned between the first conductive vias and the second conductive vias, and overlapping the transmission line in the first direction.

* * * * *